(12) United States Patent
Khlat et al.

(10) Patent No.: US 11,437,960 B2
(45) Date of Patent: Sep. 6, 2022

(54) AVERAGE POWER TRACKING POWER AMPLIFIER APPARATUS

(71) Applicant: Qorvo US, Inc., Greensboro, NC (US)

(72) Inventors: Nadim Khlat, Cugnaux (FR); Marcus Granger-Jones, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/080,065

(22) Filed: Oct. 26, 2020

(65) Prior Publication Data

US 2021/0126599 A1 Apr. 29, 2021

Related U.S. Application Data

(60) Provisional application No. 62/927,190, filed on Oct. 29, 2019.

(51) Int. Cl.
| | |
|---|---|
| *H03F 1/07* | (2006.01) |
| *H03F 3/24* | (2006.01) |
| *H03F 3/195* | (2006.01) |

(52) U.S. Cl.
CPC ............ *H03F 3/245* (2013.01); *H03F 3/195* (2013.01); *H03F 2200/451* (2013.01); *H03F 2200/504* (2013.01)

(58) Field of Classification Search
CPC .................................... H03F 1/02; H03F 1/07
USPC .............................................. 330/124 R, 295
See application file for complete search history.

(56) References Cited

U.S. PATENT DOCUMENTS

| | | | |
|---|---|---|---|
| 6,720,829 B2 | 4/2004 | Matsuyoshi et al. | |
| 7,256,649 B2 | 8/2007 | Ksienski et al. | |
| 8,761,834 B2 * | 6/2014 | Luz | H04B 7/0413 455/561 |
| 10,211,785 B2 * | 2/2019 | McLaren | H03F 1/56 |
| 2003/0214355 A1 * | 11/2003 | Luz | H03F 3/24 330/124 R |
| 2009/0258617 A1 | 10/2009 | Yoshihara | |
| 2012/0229207 A1 * | 9/2012 | Huang | H03F 3/68 330/124 R |
| 2014/0118063 A1 | 5/2014 | Briffa et al. | |

(Continued)

FOREIGN PATENT DOCUMENTS

EP 1191707 A1 3/2002

OTHER PUBLICATIONS

Non-Final Office Action for U.S. Appl. No. 16/742,976, dated Aug. 28, 2020, 9 pages.

(Continued)

*Primary Examiner* — Henry Choe
(74) *Attorney, Agent, or Firm* — Withrow & Terranova, P.L.L.C.

(57) ABSTRACT

An average power tracking (APT) power amplifier apparatus is provided. In a non-limiting example, the APT power amplifier apparatus includes multiple sets of power amplifier circuits configured to amplify a radio frequency (RF) signal(s) for transmission in different polarizations (e.g., vertical and horizontal). In examples disclosed herein, the APT power amplifier apparatus can be configured to employ a single power management integrated circuit (PMIC) to provide an APT voltage to all of the power amplifier circuits for amplifying the RF signal(s). By employing a single PMIC in the APT power amplifier apparatus, it is possible to reduce footprint, power consumption, and costs of the APT power amplifier apparatus.

20 Claims, 3 Drawing Sheets

(56) References Cited

U.S. PATENT DOCUMENTS

2016/0173031 A1  6/2016 Langer
2017/0005619 A1  1/2017 Khlat
2020/0403661 A1  12/2020 Khlat

OTHER PUBLICATIONS

Final Office Action for U.S. Appl. No. 16/742,976, dated Aug. 23, 2021, 12 pages.
Non-Final Office Action for U.S. Appl. No. 16/742,976, dated Mar. 3, 2021, 10 pages.
Notice of Allowance for U.S. Appl. No. 16/742,976, dated Nov. 17, 2021, 12 pages.
International Search Report and Written Opinion for PCT/US2021/054105, dated Jan. 21, 2022, 17 pages.
Notice of Allowance for U.S. Appl. No. 16/742,976, dated Mar. 21, 2022, 13 pages.

* cited by examiner

AVERAGE POWER TRACKING POWER AMPLIFIER APPARATUS

RELATED APPLICATIONS

This application claims the benefit of provisional patent application Ser. No. 62/927,190, filed Oct. 29, 2019, the disclosure of which is hereby incorporated herein by reference in its entirety.

FIELD OF THE DISCLOSURE

The technology of the disclosure relates generally to a radio frequency (RF) power amplifier apparatus.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Wi-Fi, long-term evolution (LTE), and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Average power tracking (APT) is a well-known power management technology designed to improve efficiency levels of power amplifiers to help reduce power consumption and thermal dissipation in a mobile communication device. In an APT based power amplifier apparatus, a power management circuit(s) is configured to provide a supply voltage(s) to a power amplifier(s) based on an average power envelope of an RF signal(s) being amplified by the power amplifier(s). Notably, the RF signal(s) may be radiated from different antennas or antenna arrays in different polarizations (e.g., vertical and horizontal). Since the average power envelope of the RF signal(s) may be different in different polarizations, it may be necessary to amplify the RF signal(s) using different sets of power amplifiers. Accordingly, the APT based power amplifier apparatus may need to employ multiple power management circuits to provide different supply voltages to the different sets of power amplifiers, which can lead to increased footprint, power consumption, and costs of the APT based power amplifier apparatus. Hence, it is desirable to employ fewer numbers of power management circuits in the APT based power amplifier apparatus.

SUMMARY

Embodiments of the disclosure relate to an average power tracking (APT) power amplifier apparatus. In a non-limiting example, the APT power amplifier apparatus includes multiple sets of power amplifier circuits configured to amplify a radio frequency (RF) signal(s) for transmission in different polarizations (e.g., vertical and horizontal). In examples disclosed herein, the APT power amplifier apparatus can be configured to employ a single power management integrated circuit (PMIC) to provide an APT voltage to all of the power amplifier circuits for amplifying the RF signal(s). By employing a single PMIC in the APT power amplifier apparatus, it is possible to reduce footprint, power consumption, and costs of the APT power amplifier apparatus.

In one aspect, an APT power amplifier apparatus is provided. The APT power amplifier apparatus includes a number of first power amplifier circuits configured to amplify a number of first composite RF signals each comprising a respective one of a number of first RF signals and a respective one of a number of second RF signals. The APT power amplifier apparatus also includes a number of second power amplifier circuits configured to amplify a number of second composite RF signals each comprising the respective one of the number of first RF signals and the respective one of the number of second RF signals. The APT power amplifier apparatus also includes a number of output circuits. The output circuits are each configured to receive a respective one of the number of first composite RF signals from a respective one of the number of first power amplifier circuits. The output circuits are each configured to receive a respective one of the number of second composite RF signals from a respective one of the number of second power amplifier circuits. The output circuits are each configured to regenerate a respective one of the number of first RF signals and a respective one of the number of second RF signals based on the respective one of the number of first composite RF signals and the respective one of the number of second composite RF signals.

In another aspect, an APT power amplifier apparatus is provided. The APT power amplifier apparatus includes a number of first signal outputs coupled to a first antenna array configured to radiate a number of first RF signals in a first polarization. The APT power amplifier apparatus also includes a number of second signal outputs coupled to a second antenna array configured to radiate a number of second RF signals in a second polarization perpendicular to the first polarization. The APT power amplifier apparatus also includes a number of first power amplifier circuits configured to amplify a number of first composite RF signals each comprising a respective one of the number of first RF signals and a respective one of the number of second RF signals. The APT power amplifier apparatus also includes a number of second power amplifier circuits configured to amplify a number of second composite RF signals each comprising the respective one of the number of first RF signals and the respective one of the number of second RF signals. The APT power amplifier apparatus also includes a number of output circuits. The output circuits are each configured to receive a respective one of the number of first composite RF signals from a respective one of the number of first power amplifier circuits. The output circuits are each configured to receive a respective one of the number of second composite RF signals from a respective one of the number of second power amplifier circuits. The output circuits are each configured to regenerate a respective one of the number of first RF signals and a respective one of the number of second RF signals based on the respective one of the number of first composite RF signals and the respective one of the number of second composite RF signals.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an average power tracking (APT) power amplifier apparatus. In a non-limiting example, the APT power amplifier apparatus includes multiple sets of power amplifier circuits configured to amplify a radio frequency (RF) signal(s) for transmission in different polarizations (e.g., vertical and horizontal). In examples disclosed herein, the APT power amplifier apparatus can be configured to employ a single power management integrated circuit (PMIC) to provide an APT voltage to all of the power amplifier circuits for amplifying the RF signal(s). By employing a single PMIC in the APT power amplifier apparatus, it is possible to reduce footprint, power consumption, and costs of the APT power amplifier apparatus.

Figure 1:
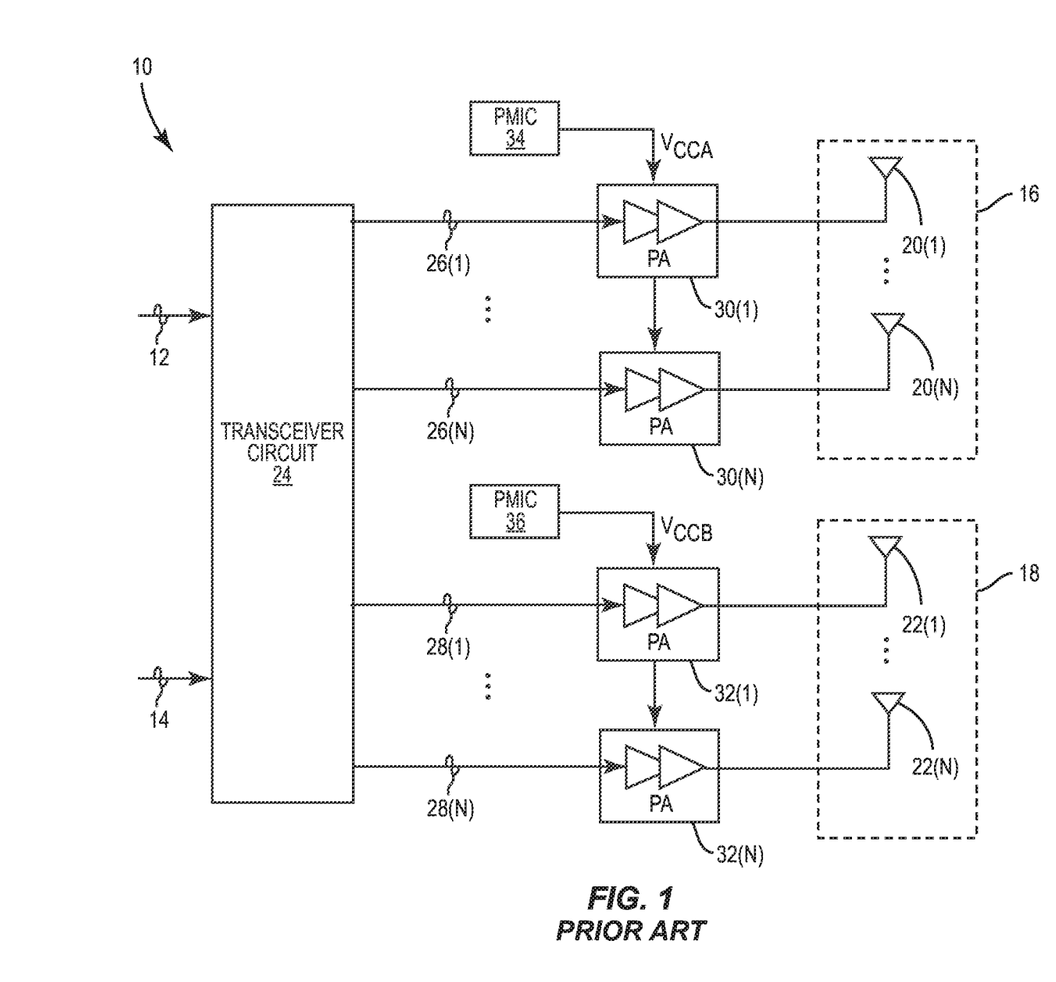
FIG. 1 is a schematic diagram of an exemplary conventional power amplifier apparatus configured to amplify a pair of input signals for concurrent transmission from a pair of antenna arrays.
Figure 2:
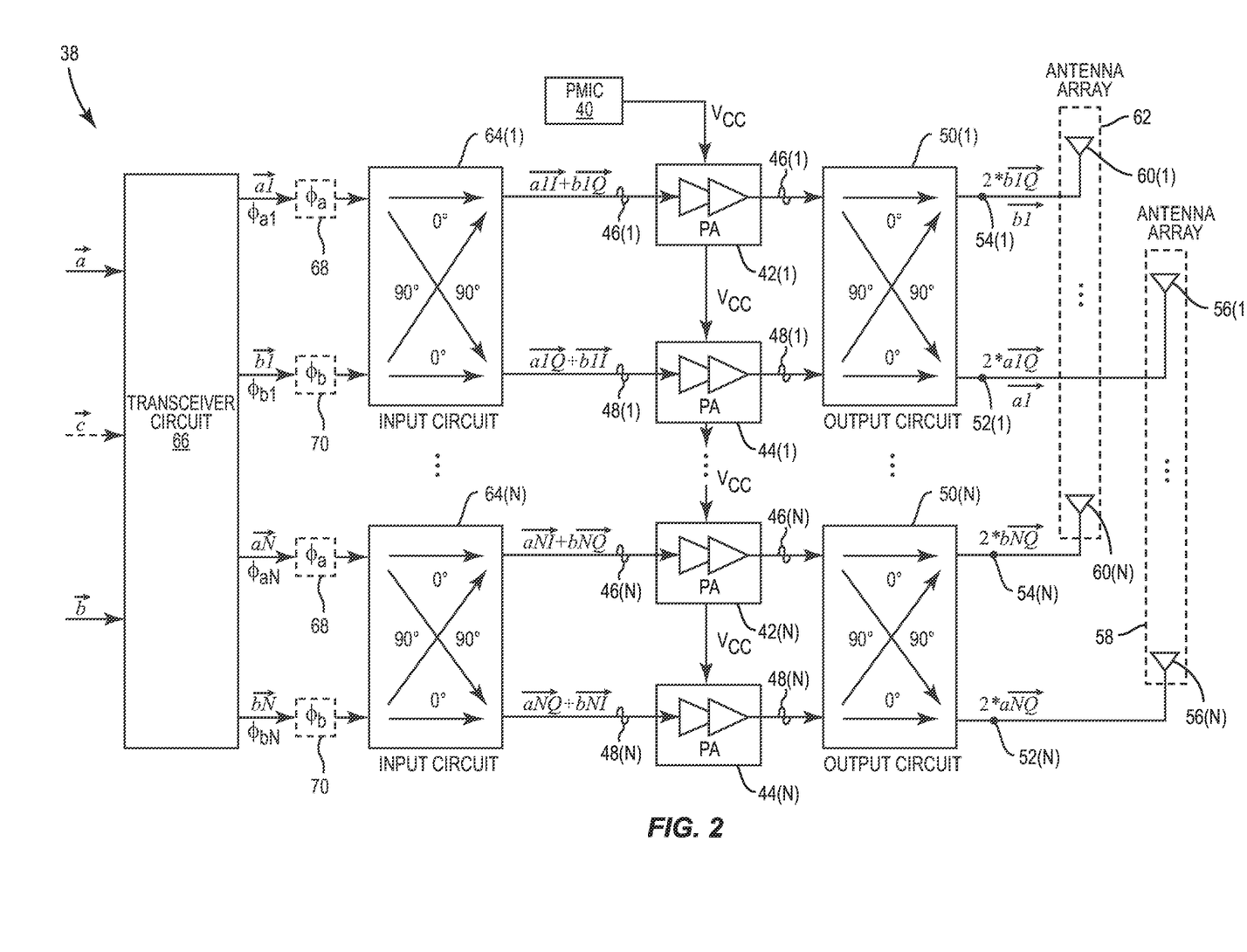
FIG. 2 is a schematic diagram of an exemplary average power tracking (APT) power amplifier apparatus configured according to an embodiment of the present disclosure to amplify a number of first radio frequency (RF) signals and a number of second RF signals based on a single power management integrated circuit (PMIC)

Before discussing an APT power amplifier apparatus of the present disclosure, starting at FIG. 2, a brief overview of a conventional power amplifier apparatus is first provided with reference to FIG. 1 to help understand the challenges associated with amplifying multiple RF signals with a same or different peak power for concurrent transmission.

In this regard, FIG. 1 is a schematic diagram of an exemplary conventional power amplifier apparatus 10 configured to amplify a first input signal 12 and a second input signal 14 for concurrent transmission from a first antenna array 16 and a second antenna array 18, respectively. The first antenna array 16 can include a number of first antennas 20(1)-20(N) and the second antenna array 18 can include a number of second antennas 22(1)-22(N).

The conventional power amplifier apparatus 10 includes a transceiver circuit 24 configured to receive the first input signal 12 and the second input signal 14. The transceiver circuit 24 is configured to generate a number of first RF signals 26(1)-26(N) from the first input signal 12 and a number of second RF signals 28(1)-28(N) from the second input signal 14. The transceiver circuit 24 is configured to generate the first RF signals 26(1)-26(N) with phase coherency such that the first antennas 20(1)-20(N) can radiate the first RF signals 26(1)-26(N) via RF beamforming. Likewise, the transceiver circuit 24 is configured to generate the second RF signals 28(1)-28(N) with phase coherency such that the second antennas 22(1)-22(N) can radiate the second RF signals 28(1)-28(N) via RF beamforming.

The conventional power amplifier apparatus 10 includes a number of first power amplifier circuits 30(1)-30(N) to amplify the first RF signals 26(1)-26(N), respectively. The conventional power amplifier apparatus 10 also includes a number of second power amplifier circuits 32(1)-32(N) to amplify the second RF signals 28(1)-28(N), respectively.

Notably, the first input signal 12 can have a different peak-to-average ratio (PAR) compared to the second input signal 14. As such, the first RF signals 26(1)-26(N) and the second RF signals 28(1)-28(N) can be associated with different power envelopes. In this regard, to achieve a highest possible operating efficiency in the first power amplifier circuits 30(1)-30(N) and the second power amplifier circuits 32(1)-32(N), the conventional power amplifier apparatus 10 needs to employ two PMICs 34 and 36. Specifically, the PMIC 34 is configured to generate a first time-variant average voltage $V_{CCA}$ for the first power amplifier circuits 30(1)-30(N) based on an average power of the first RF signals 26(1)-26(N). Likewise, the PMIC 36 is configured to generate a second time-variant average voltage $V_{CCB}$ for the second power amplifier circuits 32(1)-32(N) based on an average power of the second RF signals 28(1)-28(N). Understandably, by employing the PMICs 34 and 36, the conventional power amplifier apparatus 10 may occupy a larger footprint, consume more power, and become more expensive. Hence, it is desirable to reduce a number of the PMICs 34 and 36 in the conventional power amplifier apparatus 10 to help reduce footprint, power consumption, and cost.

In this regard, FIG. 2 is a schematic diagram of an exemplary APT power amplifier apparatus 38 configured according to an embodiment of the present disclosure to amplify a number of first RF signals $\vec{a1}$-$\vec{aN}$ and a number of second RF signals $\vec{b1}$-$\vec{bN}$ based on a single PMIC 40. The APT power amplifier apparatus 38 includes a number of first power amplifier circuits 42(1)-42(N) and a number of second power amplifier circuits 44(1)-44(N).

As discussed in detail below, the first power amplifier circuits 42(1)-42(N) are configured to amplify a number of first composite RF signals 46(1)-46(N), respectively. Each of the first composite RF signals 46(1)-46(N) includes a respective one of the first RF signals $\vec{a1}$-$\vec{aN}$ and a respective one of the second RF signals $\vec{b1}$-$\vec{bN}$. Similarly, the second power amplifier circuits 44(1)-44(N) are configured to amplify a number of second composite RF signals 48(1)-48(1), respectively. Each of the second composite RF signals 48(1)-48(N) includes a respective one of the first RF signals $\vec{a1}$-$\vec{aN}$ and a respective one of the second RF signals $\vec{b1}$-$\vec{bN}$. Study shows that each of the first composite RF signals 46(1)-46(N) and each of the second composite RF signals 48(1)-48(N) can be so generated to have substantially similar average power and/or PAR, regardless of actual peak power and/or PAR associated with the first RF signals $\vec{a1}$-$\vec{aN}$ and the second RF signals $\vec{b1}$-$\vec{bN}$. Herein, the first composite RF signals 46(1)-46(N) and the second composite RF signals 48(1)-48(N) are said to have substantially similar average power if the average powers among the first composite RF signals 46(1)-46(N) and the second composite RF signals 48(1)-48(N) differ by less than 0.003 dBm.

In this regard, given that the first composite RF signals 46(1)-46(N) and the second composite RF signals 48(1)-48(N) have substantially similar average power, it is possible to operate the first power amplifier circuits 42(1)-42(N) and the second power amplifier circuits 44(1)-44(N) at desirable operation efficiencies based on a time-variant average voltage $V_{CC}$, which can be an average voltage that changes symbol-to-symbol or frame-to-frame. As such, it is possible to employ exclusively the PMIC 40 to generate the same time-variant average voltage $V_{CC}$, which can be an APT voltage tracking the substantially similar average power and/or PAR on the symbol-to-symbol or the frame-to-frame basis, for the first power amplifier circuits 42(1)-42(N) and the second power amplifier circuits 44(1)-44(N), thus making it possible to reduce footprint, power consumption, and cost of the APT power amplifier apparatus 38, compared to the conventional power amplifier apparatus 10 of FIG. 1.

The APT power amplifier apparatus 38 includes a number of output circuits 50(1)-50(N). Each of the output circuits 50(1)-50(N) is configured to receive a respective one of the first composite RF signals 46(1)-46(N) from a respective one of the first power amplifier circuits 42(1)-42(N). Each of the output circuits 50(1)-50(N) is also configured to receive a respective one of the second composite RF signals 48(1)-48(N) from a respective one of the second power amplifier circuits 44(1)-44(N). For example, the output circuit 50(1) receives the respective first composite RF signal 46(1) from the respective first power amplifier circuit 42(1). The output circuit 50(1) also receives the respective second composite RF signal 48(1) from the respective second power amplifier circuit 44(1).

Accordingly, each of the output circuits 50(1)-50(N) can be configured to regenerate a respective one of the first RF signals $\vec{a1}$-$\vec{aN}$ and a respective one of the second RF signals $\vec{b1}$-$\vec{bN}$ based on the respective one of the first composite RF signals 46(1)-46(N) and the respective one of the second composite RF signals 48(1)-48(N). For example, the output circuit 50(1) can be configured to regenerate the respective first RF signal $\vec{a1}$ and the respective second RF signal $\vec{b1}$ from the respective first composite RF signal 46(1) and the respective second composite RF signal 48(1).

In a non-limiting example, the APT power amplifier apparatus 38 includes a number of first signal outputs 52(1)-52(N) and a number of second signal outputs 54(1)-54(N). The first signal outputs 52(1)-52(N) are coupled to a number of first antennas 56(1)-56(N) in a first antenna array 58, respectively. The second signal outputs 54(1)-54(N) are coupled to a number of second antennas 60(1)-60(N) in a second antenna array 62, respectively.

In one embodiment, the first antenna array 58 may be configured to radiate the first RF signals $\vec{a1}$-$\vec{aN}$ in a first polarization (e.g., vertical or horizontal polarization) and the second antenna array 62 may be configured to radiate the second RF signals $\vec{b1}$-$\vec{bN}$ in a second polarization perpendicular to the first polarization (e.g., horizontal or vertical polarization). In this regard, the first antenna array 58 and the second antenna array 62 may radiate the first RF signals $\vec{a1}$-$\vec{aN}$ and the second RF signals $\vec{b1}$-$\vec{bN}$ concurrently. In a non-limiting example, the first antenna array 58 and the second antenna array 62 can be a single patch antenna array with multiple patches. In this regard, the first RF signals $\vec{a1}$-$\vec{aN}$ in the first polarization and the second RF signals $\vec{b1}$-$\vec{bN}$ in the second polarization are injected into different edges of the square patch antenna array.

In another embodiment, the first antenna array 58 may be provided on a top edge of a wireless device and the second antenna array may be provided on a bottom edge of the wireless device to help mitigate so-called "hand-blocking" effect. In this regard, the first antenna array 58 and the second antenna array 62 may radiate the first RF signals $\vec{a1}$-$\vec{aN}$ and the second RF signals $\vec{b1}$-$\vec{bN}$ alternately.

Accordingly, the output circuits 50(1)-50(N) are configured to regenerate the first RF signals $\vec{a1}$-$\vec{aN}$ at the first signal outputs 52(1)-52(N), respectively. In addition, the output circuits 50(1)-50(N) are also configured to regenerate the second RF signals $\vec{b1}$-$\vec{bN}$ at the second signal outputs 54(1)-54(N), respectively. In one embodiment, the first antenna array 58 and the second antenna array 62 can be part of the APT power amplifier apparatus 38. In another embodiment, the first antenna array 58 and the second antenna array 62 can be externally coupled to the APT power amplifier apparatus 38.

The APT power amplifier apparatus 38 may include a number of input circuits 64(1)-64(N). The input circuits 64(1)-64(N) are configured to receive the first RF signals $\vec{a1}$-$\vec{aN}$ and the second RF signals $\vec{b1}$-$\vec{bN}$. Accordingly, the input circuits 64(1)-64(N) generate the first composite RF signals 46(1)-46(N) and the second composite RF signals 48(1)-48(N). The input circuits 64(1)-64(N) are coupled to the first power amplifier circuits 42(1)-42(N) and the second power amplifier circuits 44(1)-44(N). As such, the input circuits 64(1)-64(N) can provide the first composite RF signals 46(1)-46(N) to the first power amplifier circuits 42(1)-42(N), respectively, and provide the second composite RF signals 48(1)-48(N) to the second power amplifier circuits 44(1)-44(N), respectively.

As previously mentioned, the first composite RF signals 46(1)-46(N) and the second composite RF signals 48(1)-48(N) can each include a respective one of the first RF signals $\vec{a1}$-$\vec{aN}$ and a respective one of the second RF signals $\vec{b1}$-$\vec{bN}$. In this regard, the input circuits 64(1)-64(N) can be configured to split the first RF signals $\vec{a1}$-$\vec{aN}$ into a number of in-phase components (I-components) $\vec{a1I}$-$\vec{aNI}$ and a number of quadrature components (Q-components) $\vec{a1Q}$-$\vec{aNQ}$, respectively. Understandably, the I-components $\vec{a1I}$-$\vec{aNI}$ and the Q-components $\vec{a1Q}$-$\vec{aNQ}$ each have one-half (½) power of a respective one of the first RF signals $\vec{a1}$-$\vec{aN}$. Likewise, the input circuits 64(1)-64(N) can be configured to split the second RF signals $\vec{b1}$-$\vec{bN}$ into a number of I-components $\vec{b1I}$-$\vec{bNI}$ and a number of Q-components $\vec{b1Q}$-$\vec{bNQ}$, respectively. Understandably, the I-components $\vec{b1I}$-$\vec{bNI}$ and the Q-components $\vec{b1Q}$-$\vec{bNQ}$ each have ½ power of a respective one of the second RF signals $\vec{b1}$-$\vec{bN}$.

In one non-limiting example, the input circuits 64(1)-64(N) are configured to generate the first composite RF signals 46(1)-46(N) to include the I-components $\vec{a1I}$-$\vec{aNI}$ and the Q-components $\vec{b1Q}$-$\vec{bNQ}$, respectively. The input circuits 64(1)-64(N) are also configured to generate the second composite RF signals 48(1)-48(N) to include the Q-components $\vec{a1Q}$-$\vec{aNQ}$ and the I-components $\vec{b1I}$-$\vec{bNI}$, respectively. Studies have shown that the first composite RF signals 46(1)-46(N) and the second composite RF signals 48(1)-48(N) as generated by the input circuits 64(1)-64(N) can have substantially similar average power. As a result, the first power amplifier circuits 42(1)-42(N) and the second power amplifier circuits 44(1)-44(N) can all operate based on the same time-variant average voltage $V_{CC}$ without compromising operating efficiency. Specifically, the first power amplifier circuits 42(1)-42(N) are configured to amplify the first composite RF signals 46(1)-46(N), which include the I-components $\vec{a1I}$-$\vec{aNI}$ and the Q-components $\vec{b1Q}$-$\vec{bNQ}$, respectively, based on the time-variant average voltage $V_{CC}$ provided by the PMIC 40. Likewise, the second power amplifier circuits 44(1)-44(N) are configured to amplify the second composite RF signals 48(1)-48(N), which include the Q-components $\vec{a1Q}$-$\vec{aNQ}$ and the I-components $\vec{b1I}$-$\vec{bNI}$, respectively, based on the time-variant average voltage $V_{CC}$ provided by the PMIC 40.

As such, the output circuits 50(1)-50(N) will receive the first composite RF signals 46(1)-46(N) that include the I-components $\vec{a1I}$-$\vec{aNI}$ and the Q-components $\vec{b1Q}$-$\vec{bNQ}$, respectively. The output circuits 50(1)-50(N) will also receive the second composite RF signals 48(1)-48(N) that include the Q-components $\vec{a1Q}$-$\vec{aNQ}$ and the I-components $\vec{b1I}$-$\vec{bNI}$, respectively. In a non-limiting example, the output circuits 50(1)-50(N) can be configured to regenerate the first RF signals $\vec{a1}$-$\vec{aN}$ to include two-times the Q-components $\vec{a1Q}$-$\vec{aNQ}$, respectively, in addition to power amplifier gains and phase shifts. For example, the first RF signal $\vec{a1}$ as regenerated by the output circuit 50(1) will include two-times the Q-component $\vec{a1Q}$ ($\vec{a1}=2\times\vec{a1Q}$). In the same non-limiting example, the output circuits 50(1)-50(N) can be configured to regenerate the second RF signals $\vec{b1}$-$\vec{bN}$ to include two-times the Q-components $\vec{b1Q}$-$\vec{bNQ}$, respectively, in addition to power amplifier gains and phase shifts. For example, the second RF signal $\vec{b1}$ as regenerated by the output circuit 50(1) will include two-times the Q-component $\vec{b1Q}$ ($\vec{b1}=2\times\vec{b1Q}$).

In another non-limiting example, it is also possible to generate the first composite RF signals 46(1)-46(N) to include the Q-components $\vec{a1Q}$-$\vec{aNQ}$ and the I-components $\vec{b1I}$-$\vec{bNI}$, respectively. Likewise, it is also possible to generate the second composite RF signals 48(1)-48(N) to include the !-components $\vec{a1I}$-$\vec{aNI}$ and the Q-components $\vec{b1Q}$-$\vec{bNQ}$, respectively. Accordingly, the output circuits 50(1)-50(N) will regenerate the first RF signals $\vec{a1}$-$\vec{aN}$ to include two-times the I-components $\vec{a1I}$-$\vec{aNI}$, respectively. Similarly, the output circuits 50(1)-50(N) will regenerate the second RF signals $\vec{b1}$-$\vec{bN}$ to include two-times the I-components $\vec{b1I}$-$\vec{bNI}$, respectively.

The input circuits 64(1)-64(N) may receive the first RF signals $\vec{a1}$-$\vec{aN}$ and the second RF signals $\vec{b1}$-$\vec{bN}$ from a transceiver circuit 66, which may be a beamformer integrated circuit (IC) for transmitting the first RF signals $\vec{a1}$-$\vec{aN}$ and the second RF signals $\vec{b1}$-$\vec{bN}$ in millimeter-wave (mm-Wave) spectrum (e.g., below 6 GHz or above 28 GHz). The transceiver circuit 66 may be part of the APT power amplifier apparatus 38 or coupled to the APT power amplifier apparatus 38 externally. In a non-limiting example, the input circuits 64(1)-64(N) can be integrated into the transceiver circuit 66 without affecting operational principles discussed herein.

The transceiver circuit 66 may be configured to generate the first RF signals $\vec{a1}$-$\vec{aN}$ in a number of first phases $\phi_{a1}$-$\phi_{aN}$, respectively. The first phases $\phi_{a1}$-$\phi_{aN}$ may be so determined with coherency such that the first antenna array 58 can radiate the first RF signals $\vec{a1}$-$\vec{aN}$ by means of RF beamforming. Similarly, the transceiver circuit 66 may be configured to generate the second RF signals $\vec{b1}$-$\vec{bN}$ in a number of second phases $\phi_{b1}$-$\phi_{bN}$, respectively. The second antenna array 62 can radiate the second RF signals $\vec{b1}$-$\vec{abN}$ by means of RF beamforming.

The transceiver circuit 66 may also determine the first phases $\phi_{a1}$-$\phi_{aN}$ and the second phases $\phi_{b1}$-$\phi_{bN}$ to cause the first composite RF signals 46(1)-46(N) and the second composite RF signals 48(1)-48(N) to have substantially similar average power. In this regard, in one embodiment, the APT power amplifier apparatus 38 may further include a first phase adjustment circuit 68 and/or a second phase adjustment circuit 70. The first phase adjustment circuit 68 may be configured to adjust the first phases $\phi_{a1}$-$\phi_{aN}$ to cause the first composite RF signals 46(1)-46(N) and the second composite RF signals 48(1)-48(N) to have substantially similar average power. Likewise, the second phase adjustment circuit 70 may be configured to adjust the second phases $\phi_{b1}$-$\phi_{bN}$ to cause the first composite RF signals 46(1)-46(N) and the second composite RF signals 48(1)-48(N) to have substantially similar average power.

Figure 3:
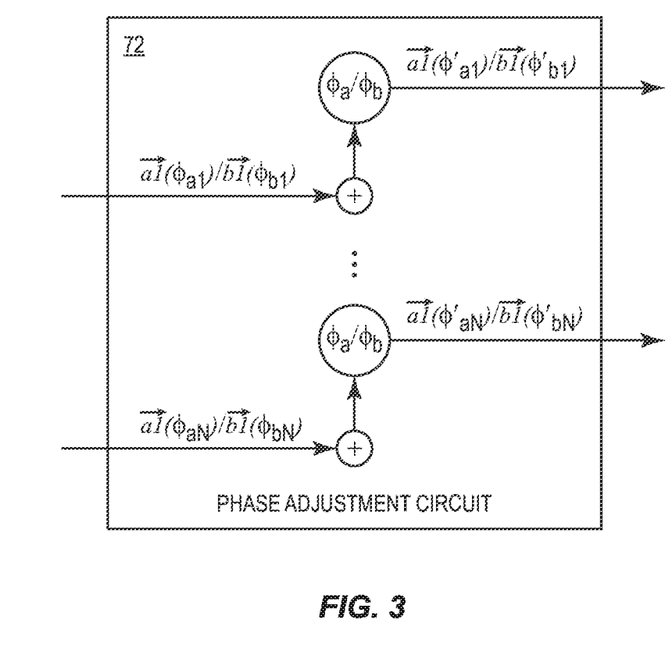
FIG. 3 is a schematic diagram of an exemplary phase adjustment circuit that can be provided in the APT power amplifier apparatus of FIG. 2.

FIG. 3 is a schematic diagram of an exemplary phase adjustment circuit 72, which can be provided in the APT power amplifier apparatus 38 of FIG. 2 as any of the first phase adjustment circuit 68 and the second phase adjustment circuit 70. Common elements between FIGS. 2 and 3 are shown therein with common element numbers and will not be re-described herein.

In one non-limiting example, the phase adjustment circuit 72 receives the first RF signals $\vec{a1}$-$\vec{aN}$ associated with the first phases $\phi_{a1}$-$\phi_{aN}$, respectively. Accordingly, the phase adjustment circuit 72 adjusts each of the first phases $\phi_{a1}$-$\phi_{aN}$ by a common phase angle $\phi_a$. As a result, the first RF signals $\phi_{a1}$-$\phi_{aN}$ outputted by the phase adjustment circuit 72 will be associated with the first phases $\phi'_{a1}$-$\phi'_{aN}$, respectively. The common phase angle $\phi_a$ may be so determined to cause the first composite RF signals 46(1)-46(N) and the second composite RF signals 48(1)-48(N) to have substantially similar average power.

In another non-limiting example, the phase adjustment circuit 72 receives the second RF signals $\vec{b1}$-$\vec{bN}$ associated with the second phases $\phi_{b1}$-$\phi_{bN}$, respectively. Accordingly, the phase adjustment circuit 72 adjusts each of the second phases $\phi_{b1}$-$\phi_{bN}$ by a common phase angle $\phi_b$. As a result, the second RF signals $\vec{b1}$-$\vec{bN}$ outputted by the phase adjustment circuit 72 will be associated with the second phases $\phi'_{b1}$-$\phi'_{bN}$, respectively. The common phase angle $\phi_b$ may be so determined to cause the first composite RF signals 46(1)-46(N) and the second composite RF signals 48(1)-48(N) to have substantially similar average power.

With reference back to FIG. 2, the transceiver circuit 66 may generate the first RF signals $\vec{a1}$-$\vec{aN}$ and the second RF signals $\vec{b1}$-$\vec{bN}$ based on a first input signal $\vec{a1}$ and a second input signal $\vec{b1}$. In a non-limiting example, the first input signal $\vec{a1}$ and the second input signal $\vec{b1}$ are different signals configured to be radiated concurrently from the first antenna array 58 and the second antenna array 62 in different polarizations (e.g., vertical and horizontal).

The transceiver circuit 66 may also generate the first RF signals $\vec{a1}$-$\vec{aN}$ and the second RF signals $\vec{b1}$-$\vec{bN}$ based on a single input signal $\vec{c}$. In a non-limiting example, the input signal $\vec{c}$ is configured to radiate alternately from the first antenna array 58 and the second antenna array 62, which may be provided in different locations (e.g., top edge and bottom edge) of a wireless device.

Those skilled in the art will recognize improvements and modifications to the preferred embodiments of the present disclosure. All such improvements and modifications are considered within the scope of the concepts disclosed herein and the claims that follow.

What is claimed is:

1. An average power tracking (APT) power amplifier apparatus comprising:
   a plurality of first power amplifier circuits configured to amplify a plurality of first composite radio frequency (RF) signals each comprising a respective one of a plurality of first RF signals and a respective one of a plurality of second RF signals;
   a plurality of second power amplifier circuits configured to amplify a plurality of second composite RF signals each comprising the respective one of the plurality of first RF signals and the respective one of the plurality of second RF signals; and
   a plurality of output circuits each configured to:
      receive a respective one of the plurality of first composite RF signals from a respective one of the plurality of first power amplifier circuits;
      receive a respective one of the plurality of second composite RF signals from a respective one of the plurality of second power amplifier circuits; and
      regenerate a respective one of the plurality of first RF signals and a respective one of the plurality of second RF signals based on the respective one of the plurality of first composite RF signals and the respective one of the plurality of second composite RF signals.

2. The APT power amplifier apparatus of claim 1 further comprising a power management integrated circuit (PMIC) configured to generate and provide a time-variant average voltage to each of the plurality of first power amplifier circuits and each of the plurality of second power amplifier circuits, wherein:
   the plurality of first power amplifier circuits is further configured to amplify the plurality of first composite RF signals based on the time-variant average voltage; and
   the plurality of second power amplifier circuits is further configured to amplify the plurality of second composite RF signals based on the time-variant average voltage.

3. The APT power amplifier apparatus of claim 2 wherein the PMIC is further configured to generate the time-variant average voltage as an average power tracking (APT) voltage.

4. The APT power amplifier apparatus of claim 1 further comprising:
a plurality of first signal outputs coupled to a first antenna array configured to radiate the plurality of first RF signals in a first polarization; and
a plurality of second signal outputs coupled to a second antenna array configured to radiate the plurality of second RF signals in a second polarization perpendicular to the first polarization;
wherein the plurality of output circuits is further configured to:
regenerate the plurality of first RF signals at the plurality of first signal outputs, respectively; and
regenerate the plurality of second RF signals at the plurality of second signal outputs, respectively.

5. The APT power amplifier apparatus of claim 4 further comprising the first antenna array and the second antenna array.

6. The APT power amplifier apparatus of claim 1 further comprising a plurality of input circuits configured to:
receive the plurality of first RF signals and the plurality of second RF signals;
generate the plurality of first composite RF signals each comprising the respective one of the plurality of first RF signals and the respective one of the plurality of second RF signals;
generate the plurality of second composite RF signals each comprising the respective one of the plurality of first RF signals and the respective one of the plurality of second RF signals;
provide the plurality of first composite RF signals to the plurality of first power amplifier circuits, respectively; and
provide the plurality of second composite RF signals to the plurality of second power amplifier circuits, respectively.

7. The APT power amplifier apparatus of claim 6 wherein the plurality of input circuits is further configured to:
generate the plurality of first composite RF signals each comprising an in-phase component (I-component) of the respective one of the plurality of first RF signals and a quadrature component (Q-component) of the respective one of the plurality of second RF signals; and
generate the plurality of second composite RF signals each comprising a Q-component of the respective one of the plurality of first RF signals and an I-component of the respective one of the plurality of second RF signals.

8. The APT power amplifier apparatus of claim 7 wherein the plurality of output circuits is further configured to:
regenerate the respective one of the plurality of first RF signals comprising two times the Q-component of the respective one of the plurality of first RF signals; and
regenerate the respective one of the plurality of second RF signals comprising two times the Q-component of the respective one of the plurality of second RF signals.

9. The APT power amplifier apparatus of claim 6 wherein the plurality of input circuits is further configured to receive the plurality of first RF signals and the plurality of second RF signals from a transceiver circuit.

10. The APT power amplifier apparatus of claim 9 further comprising the transceiver circuit.

11. The APT power amplifier apparatus of claim 10 wherein the transceiver circuit comprises the plurality of input circuits.

12. The APT power amplifier apparatus of claim 9 wherein the transceiver circuit is configured to:
generate the plurality of first RF signals in a plurality of first phases, respectively; and
generate the plurality of second RF signals in a plurality of second phases, respectively;
wherein the plurality of first phases and the plurality of second phases are so determined to cause each of the plurality of first composite RF signals and each of the plurality of second composite RF signals to have substantially similar average power and/or peak-to-average ratio (PAR).

13. The APT power amplifier apparatus of claim 12 further comprising a first phase adjustment circuit configured to adjust the plurality of first phases to cause each of the plurality of first composite RF signals and each of the plurality of second composite RF signals to have substantially similar average power and/or PAR.

14. The APT power amplifier apparatus of claim 13 wherein the first phase adjustment circuit is further configured to adjust the plurality of first phases by a common phase angle.

15. The APT power amplifier apparatus of claim 12 further comprising a second phase adjustment circuit configured to adjust the plurality of second phases to cause each of the plurality of first composite RF signals and each of the plurality of second composite RF signals to have substantially similar average power and/or PAR.

16. The APT power amplifier apparatus of claim 15 wherein the second phase adjustment circuit is further configured to adjust the plurality of second phases by a common phase angle.

17. The APT power amplifier apparatus of claim 9 wherein the transceiver circuit is configured to:
generate the plurality of first RF signals based on a first input signal; and
generate the plurality of second RF signals based on a second input signal.

18. The APT power amplifier apparatus of claim 9 wherein the transceiver circuit is configured to generate the plurality of first RF signals and the plurality of second RF signals based on a single input signal.

19. An average power tracking (APT) power amplifier apparatus comprising:
a plurality of first signal outputs coupled to a first antenna array configured to radiate a plurality of first radio frequency (RF) signals in a first polarization;
a plurality of second signal outputs coupled to a second antenna array configured to radiate a plurality of second RF signals in a second polarization perpendicular to the first polarization;
a plurality of first power amplifier circuits configured to amplify a plurality of first composite RF signals each comprising a respective one of the plurality of first RF signals and a respective one of the plurality of second RF signals;
a plurality of second power amplifier circuits configured to amplify a plurality of second composite RF signals each comprising the respective one of the plurality of first RF signals and the respective one of the plurality of second RF signals; and
a plurality of output circuits each configured to:
receive a respective one of the plurality of first composite RF signals from a respective one of the plurality of first power amplifier circuits;

receive a respective one of the plurality of second composite RF signals from a respective one of the plurality of second power amplifier circuits; and regenerate a respective one of the plurality of first RF signals and a respective one of the plurality of second RF signals based on the respective one of the plurality of first composite RF signals and the respective one of the plurality of second composite RF signals.

20. The APT power amplifier apparatus of claim 19 further comprising a power management integrated circuit (PMIC) configured to generate and provide a time-variant average voltage to each of the plurality of first power amplifier circuits and each of the plurality of second power amplifier circuits, wherein:

the plurality of first power amplifier circuits is further configured to amplify the plurality of first composite RF signals based on the time-variant average voltage; and the plurality of second power amplifier circuits is further configured to amplify the plurality of second composite RF signals based on the time-variant average voltage.

\* \* \* \* \*

UNITED STATES PATENT AND TRADEMARK OFFICE
CERTIFICATE OF CORRECTION

| | | |
|---|---|---|
| PATENT NO. | : 11,437,960 B2 | Page 1 of 1 |
| APPLICATION NO. | : 17/080065 | |
| DATED | : September 6, 2022 | |
| INVENTOR(S) | : Nadim Khlat and Marcus Granger-Jones | |

It is certified that error appears in the above-identified patent and that said Letters Patent is hereby corrected as shown below:

In the Specification

Column 8, Line 56, replace "!-components" with --I-components--.

Column 9, Lines 21-23, replace "The second antenna array 62 can radiate the second RF signals $\overrightarrow{b1} - \overrightarrow{abN}$ by means of RF beamforming." with --The second phases $\phi_{b1}$-$\phi_{bN}$ may be so determined with coherency such that the second antenna array 62 can radiate the second RF signals $\overrightarrow{b1} - \overrightarrow{abN}$ by means of RF beamforming.--.

Column 9, Lines 52-53, replace "the first RF signals $\phi_{a1}$-$\phi_{aN}$" with --the first RF signals $\overrightarrow{a1} - \overrightarrow{aN}$--.

Signed and Sealed this
Twenty-fifth Day of October, 2022

Katherine Kelly Vidal
*Director of the United States Patent and Trademark Office*